(12) United States Patent
Hasegawa

(10) Patent No.: US 7,091,564 B2
(45) Date of Patent: Aug. 15, 2006

(54) SEMICONDUCTOR CHIP WITH FUSE UNIT

(75) Inventor: Takehiro Hasegawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 10/933,525

(22) Filed: Sep. 3, 2004

(65) Prior Publication Data

US 2005/0023563 A1 Feb. 3, 2005

Related U.S. Application Data

(62) Division of application No. 10/178,748, filed on Jun. 25, 2002, now Pat. No. 6,818,957.

(30) Foreign Application Priority Data

Jun. 26, 2001 (JP) ............................. 2001-193014

(51) Int. Cl.
*H01L 29/76* (2006.01)

(52) U.S. Cl. ...................... 257/372; 257/208; 257/529; 257/665; 257/730; 365/225.7; 365/200

(58) Field of Classification Search ................ 257/372, 257/208, 529, 665, 730; 365/225.7, 200
See application file for complete search history.

(56) References Cited

U.S. PATENT DOCUMENTS 5,313,424 A * 5/1994 Adams et al. ............... 365/200
5,657,280 A * 8/1997 Shin et al. ................... 365/200
6,018,488 A * 1/2000 Mishima et al. ......... 365/225.7
6,363,020 B1 3/2002 Shubat et al.
6,388,941 B1 * 5/2002 Otori et al. ............ 365/230.08
6,396,760 B1 5/2002 Behera et al.
6,542,420 B1 * 4/2003 Takase ........................ 365/200

FOREIGN PATENT DOCUMENTS

KR 2001-8596 2/2001

OTHER PUBLICATIONS

Satoru Takase. et al., "A 1.6GB/s DRAM with Flexible Mapping Redundancy Technique and Additional Refresh Scheme", IEEE International Solid-State Circuits Conference Digest of Technical Papers, 1999, pp. 410, 411, and 485.

(Continued)

*Primary Examiner*—Bradley K. Smith
*Assistant Examiner*—Douglas Menz
(74) *Attorney, Agent, or Firm*—Oblon, Spivak, McClelland, Maier & Neustadt, P.C.

(57) ABSTRACT

A semiconductor chip includes a logic circuit unit, at least one memory macro unit having a redundant memory cell which recovers a defect cell, electrode pad rows being arranged around the outside of the logic circuit unit and the memory macro unit, and the least one fuse unit group storing addresses of the defect cell and being arranged in a region along any edge of the semiconductor chip, and on the outside of the logic circuit unit, the memory macro unit and the electrode pad rows. Here, the logic circuit unit, the memory macro unit, the electrode pad rows and the fuse unit group are positioned on a semiconductor chip surface.

17 Claims, 15 Drawing Sheets

OTHER PUBLICATIONS

Shigeki Tomishima, et al., "A 1.0V 230MHz Column-Access Embedded DRAM Macro for Portable MPEG Applications", IEEE International Solid-State Circuits Conference Digest of Technical Papers, 2001, pp. 384 And 385, IEEE ISSCC 2001 Visuals Supplement, pp. 314, 315, 513 and 514.

* cited by examiner

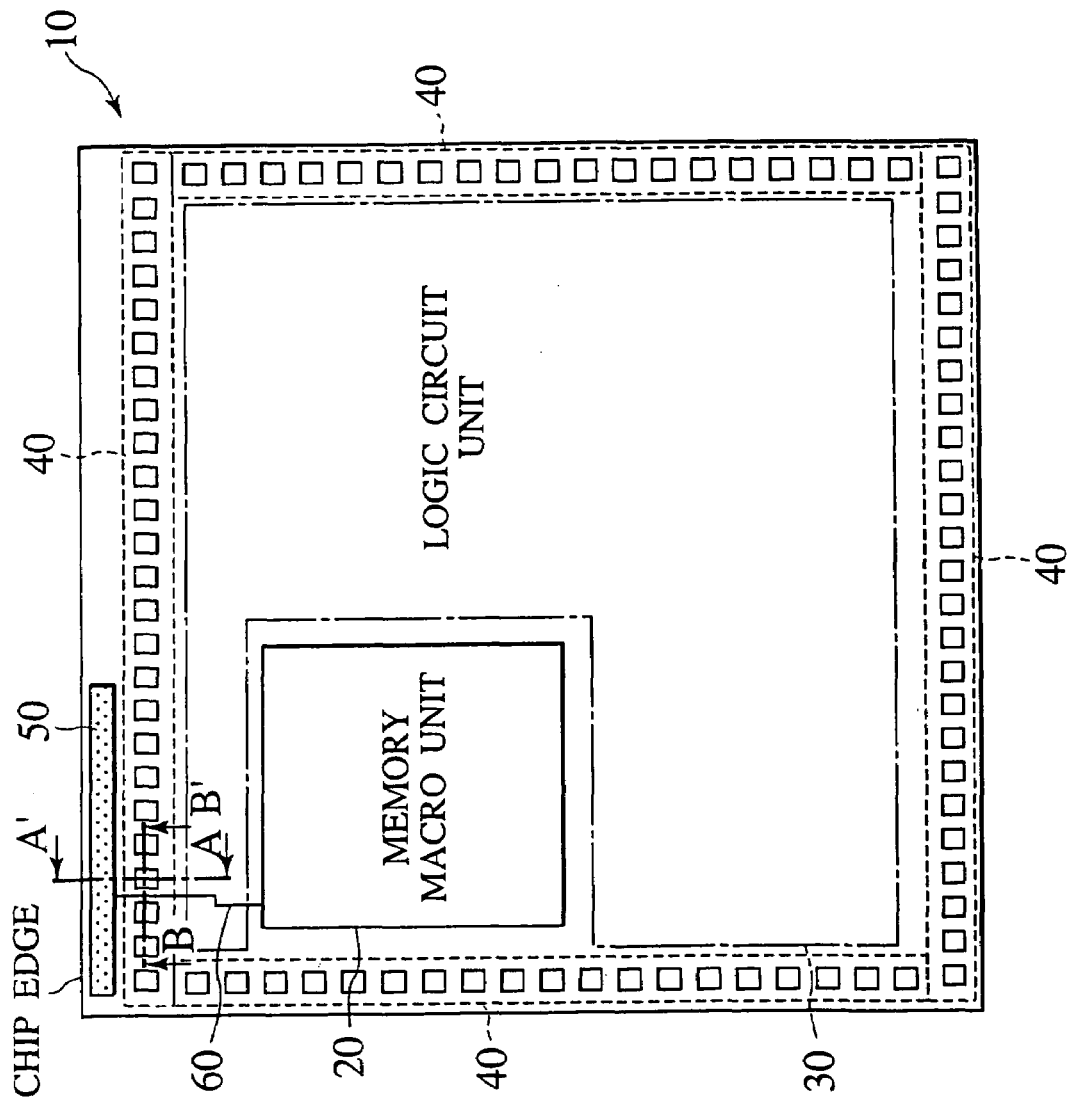

SEMICONDUCTOR CHIP WITH FUSE UNIT

CROSS REFERENCE TO RELATED APPLICATION

This application is based upon and claims the benefit of priority under 35 USC §120 from U.S. Serial No. 10/178,748, filed Jun. 25, 2002, now U.S. Pat. No. 6,818,957 and under 35 USC §119 from the prior Japanese Patent Application No. 2001-193014 filed on Jun. 26, 2001, the entire contents of which are incorporated herein by reference.

BACKGROUND OF THE INVENTION

1. Field of the Invention

The present invention relates to a semiconductor device, which has memory and a logic circuit unit mounted upon the same substrate. In particular, it is related to a semiconductor chip and a semiconductor module, which respectively include a fuse unit used for defect cell recovery in memory.

2. Description of the Related Art

Conventionally, a redundant memory structure, which has an internal defect cell recovery circuit, is widely employed in semiconductor memory chips. When there is a defect cell in a memory device, this redundant memory structure replaces it by using a spare cell.

With a semiconductor chip including this type of redundant memory structure, there is a region having a plurality of fuse units (hereafter referred to as a 'fuse unit group') on a portion of the defective memory recovery circuit.

Typically, with a semiconductor chip testing process, once the existence of a defect cell is confirmed with a tester and the specific address of the defect cell is identified, the corresponding fuse of the fuse unit is melted and blown by using a laser to store the address of the defect cell in the fuse unit.

Upon reading out a memory cell, the stored defect cell address and an inputted address are compared; if they match, a redundant cell is selected, otherwise, if they do not match, the cell of the inputted address is selected.

FIG. 1 is a planar view showing a configuration of a conventional memory chip 100. As shown in the same Figure, with the memory chip 100, electrode pad rows 200 for bonding are respectively arranged along ones of the edges of the chip. Inside thereof, a plurality of memory arrays 300 are arranged, and next to each memory array 300 a corresponding decoder circuit 500 and fuse unit group 400 are arranged.

Meanwhile, in recent years, due to reductions in mounting area and improvements in data transfer speed, memory embedded chips having memory and a logic circuit on the same substrate have come to be widely used.

FIG. 2 is a planar view showing a structural example of a conventional memory embedded chip 110. As shown in the same figure, electrode pad rows 210 for bonding are arranged along all four edges of the chip, and a logic circuit unit 700 and a memory macro unit 610 are formed there inside.

The memory macro unit 610 includes memory 600, which includes memory arrays and a decoder circuit, etc., and a fuse unit group 410. The memory macro unit 610 includes a redundant cell configuration for defect cell recovery as with the case of the memory chip 100. In this manner, the same memory functions as the conventional memory chip 100 may be included with merely the memory macro unit 610, and normally, design of the memory macro unit 610 and design of the logic circuit unit 700 are independent of each other.

In recent years, calculation processing requested of the logic circuit has become more complex, and consequently, power consumption has increased. Together with such conditions, the number of power source terminals required for the chip has increased, and interconnects such as power source lines and signal lines for connecting the logic circuit unit within the chip to the electrode pads, which function as power source terminals, have also become more complex.

In addition, the memory capacity that is loaded upon the memory embedded chip together with the logic circuit unit has increased, and the space occupied by the memory macro unit relevant to the entire chip area has increased. As a result, it has become necessary for interconnects such as the signal lines and power source lines formed in the highest layer, which connect the logic circuit unit and the electrode pads, to pass over the top of the memory macro unit.

However, since the fuse melting/blowing operation is performed after forming the interconnects on the upper-most layer, these interconnects cannot be formed above the fuse unit group. Accordingly, as shown in FIG. 2, the interconnects 800 such as the power source lines and signal lines connecting, for example, the logic circuit unit 700 and the electrode pad 210 must be routed around the fuse unit group 410. Therefore, the existence of the fuse unit group 410 places great constraints on the interconnect routing design for connecting each electrode pad 210a and the logic circuit unit 700.

Meanwhile, with recent logic circuit unit LSI, the trend in increased integration continues, further increasing the number of input/output signal terminals on a chip. In addition, due to the increase in power consumption accompanying this, the number of power source terminals has been further increased. As a result, with the conventional mounting method where the electrode pads are connected to an external board via the wire bonding, the number of electrode pads is limited, causing situations to develop where the number of terminals may be insufficient. Therefore, recent semiconductor chips are utilizing mounting methods that make use of bumps.

FIG. 3 is a planar view showing a structural example of a memory embedded chip 120 using bumps. Electrode pad rows 210 are arranged along all four edges of the chip, and a logic circuit unit 700 and a memory macro unit 610 are formed there inside. Within the memory macro unit 610, memory 600 and a fuse unit group 410 are formed.

On the chip surface, a plurality of bumps 900, which are formed as, for example, protuberances of lead, are laid out in a two-dimensional pattern. Each electrode pad 210b is connected to each corresponding bump 900 by interconnects in the upper-most layer, and then via the bumps 900 is connected to an external board. More specifically, the input/output terminals are respectively connected to electrode pads 210b on the chip edge. These electrode pads 210b are further connected to bumps 900, respectively, arranged on the chip surface. These bumps 900 are then connected to, for example, an external package board.

In this manner, in cases where bumps 900 are used, it is possible to increase the number of input/output terminals since the input/output terminals may be laid out on the chip surface in a two-dimensional pattern. In addition, since the distance between each bump terminal laid out in the two-dimensional pattern may be widened, connection with the external board also becomes easier.

Nonetheless, in this case as well, as shown in FIG. 3, the interconnect connecting each electrode pad 210b with a respective bump 900 must be routed around the fuse unit group 410. This also causes there to be electrode pads that are not connected to a bump 900, as shown in the same Figure.

In addition, bumps 900 may not be formed over the fuse unit group 410. As a result, bumps cannot be laid out in an even pattern throughout the entire chip surface. In cases where the semiconductor chip is mounted on, for example, a package board, it is easy for stress to develop in the bumps due to differences in the thermal expansion of the chip and that of the package board. Accordingly, if the bumps are not laid out evenly throughout the chip surface, an imbalance in stress may develop making it easy for problems to occur such as the package peeling back.

Moreover, with an Application Specific Integrated Circuit (ASIC), since the memory macro unit upon the chip may be arranged at the discretion of each user, the location of the fuse unit group may also differ for each user depending on the arrangement of the memory macro unit. And since the arrangement of bumps may be affected by the position of the fuse unit, various changes may be possible depending on the user. Accordingly, assuming all of these combinations, it is extremely difficult to perform ASIC layout so that problems such as peeling back of the package do not occur.

SUMMARY OF THE INVENTION

A semiconductor chip, according to a first aspect of the present invention, includes a logic circuit unit, at least one memory macro unit having a redundant memory cell which recovers a defect cell, electrode pad rows being arranged around an outside of the logic circuit unit and the memory macro unit, and at least one fuse unit group storing addresses of the defect cell and being arranged in a region along any edge of the semiconductor chip, and on an outside of the logic circuit unit, the memory macro unit and the electrode pad rows. Here, the logic circuit unit, the memory macro unit, the electrode pad rows and the fuse unit group are positioned on a semiconductor chip surface.

A semiconductor chip, according to a second aspect of the present invention, includes a logic circuit unit positioned on a semiconductor chip surface, at least one memory macro unit having a redundant memory cell which recovers a defect cell and positioned on the semiconductor chip surface, a plurality of bumps arranged in a two dimensional pattern above the logic circuit unit and the memory macro unit, and at least one fuse unit group storing addresses of the defect cell. Here, the fuse unit group is arranged along any edge of the semiconductor chip, outside of a region where the plurality of bumps are arranged and on the semiconductor chip surface.

A semiconductor module, according to a third aspect of the present invention, includes the semiconductor chip according to the above-mentioned first aspect and a package board, on which this semiconductor chip is mounted.

A semiconductor module, according to a fourth aspect of the present invention, includes the semiconductor chip according to the above-mentioned second aspect and a package board, on which this semiconductor chip is mounted.

A semiconductor module, according to a fifth aspect of the present invention, includes the semiconductor chip according to the above-mentioned second aspect, a package board on which this semiconductor chip is mounted so that the surface thereof faces the bump formation plane, an attachment resin layer which is filled in between the semiconductor chip and the package board, and soldering balls which are provided on the under-surface of the board.

BRIEF DESCRIPTION OF THE DRAWINGS

FIG. 4 is a planar view showing a structural example of a semiconductor chip according to a first embodiment of the present invention;

DETAILED DESCRIPTION OF THE EMBODIMENTS

First Embodiment

Figure 1:
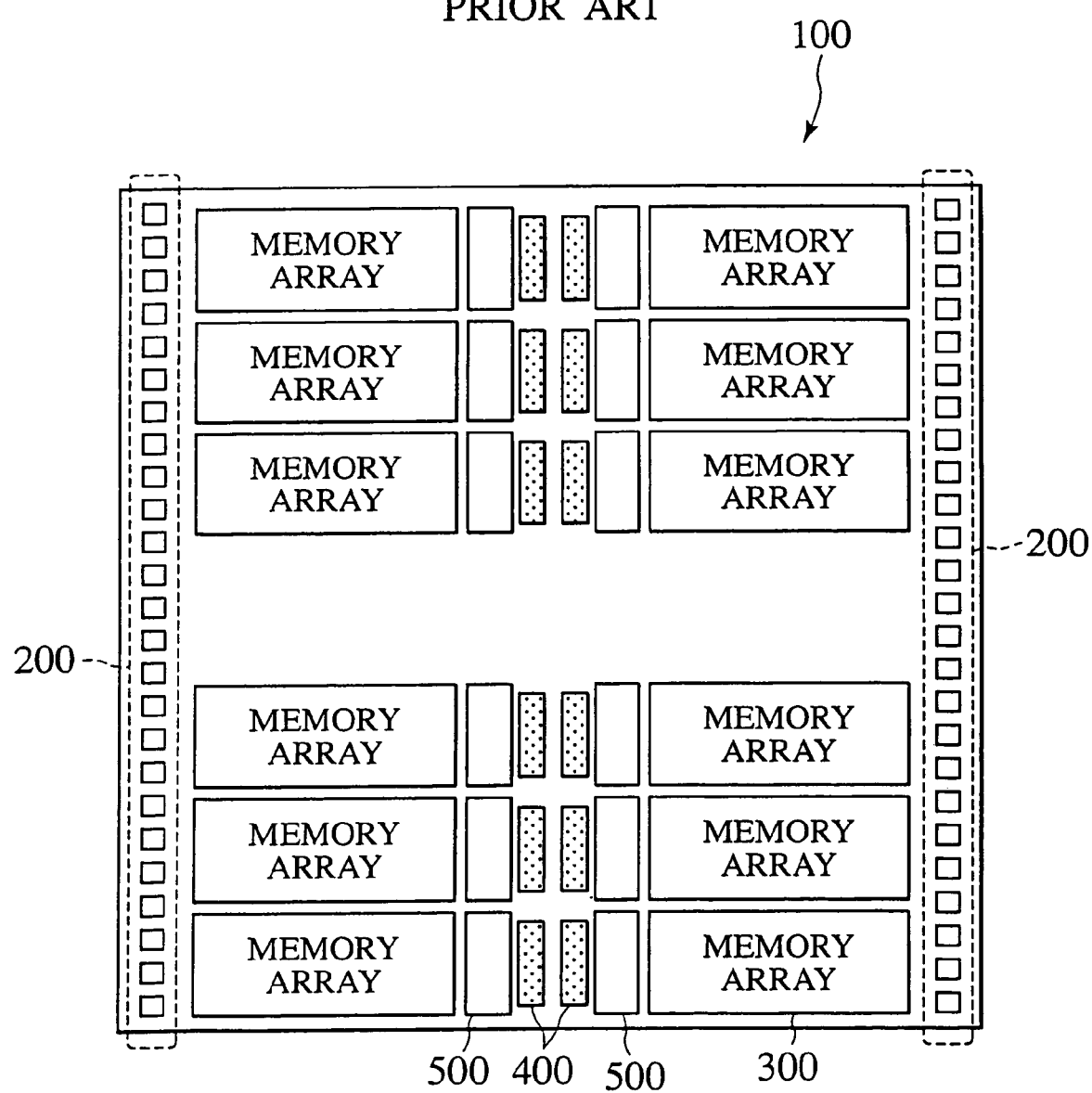
FIG. 1 is a planar view of a conventional memory chip.
Figure 2:
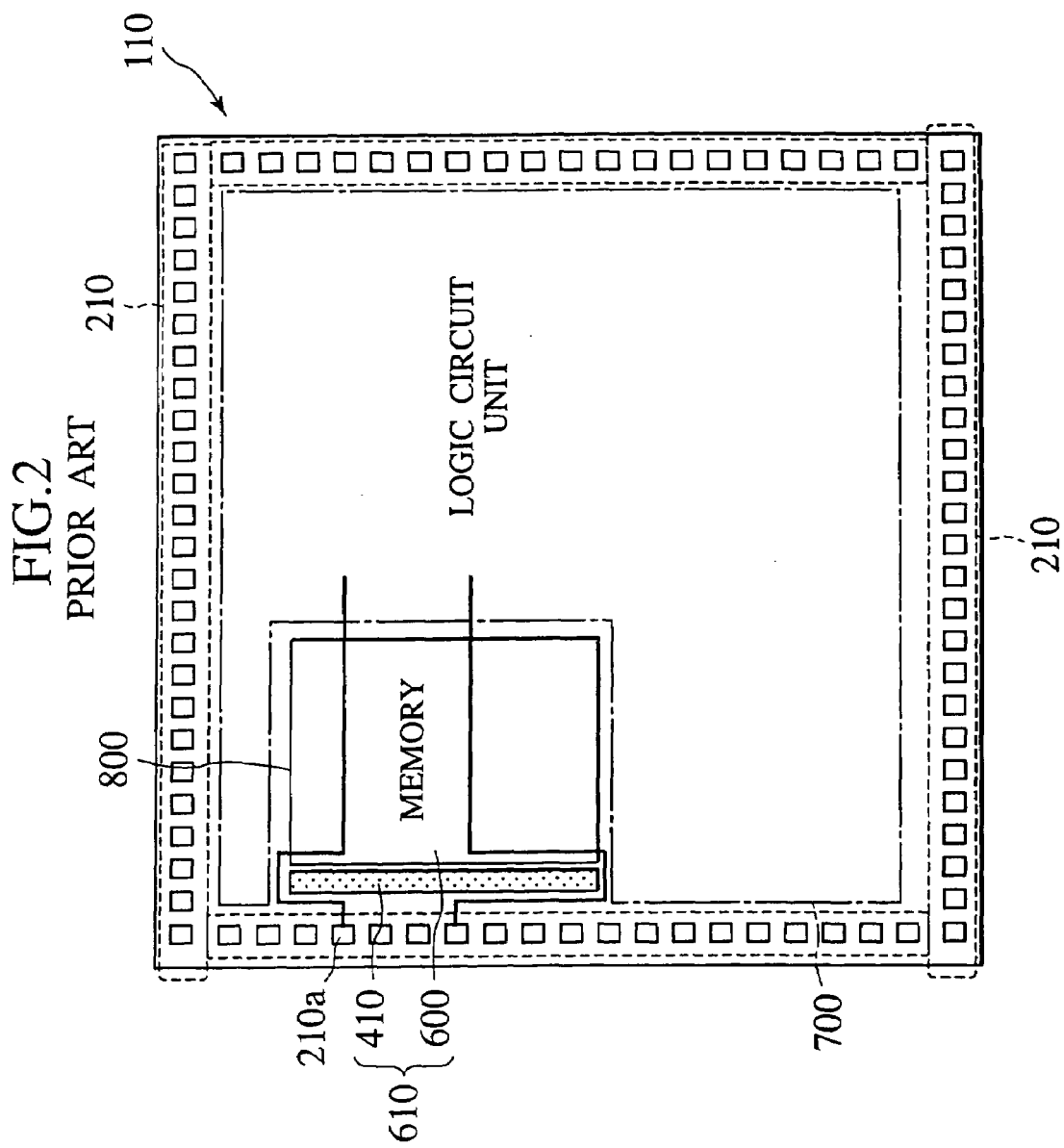
FIG. 2 is a planar view of the conventional chip with a logic circuit unit and a memory macro unit.
Figure 3:
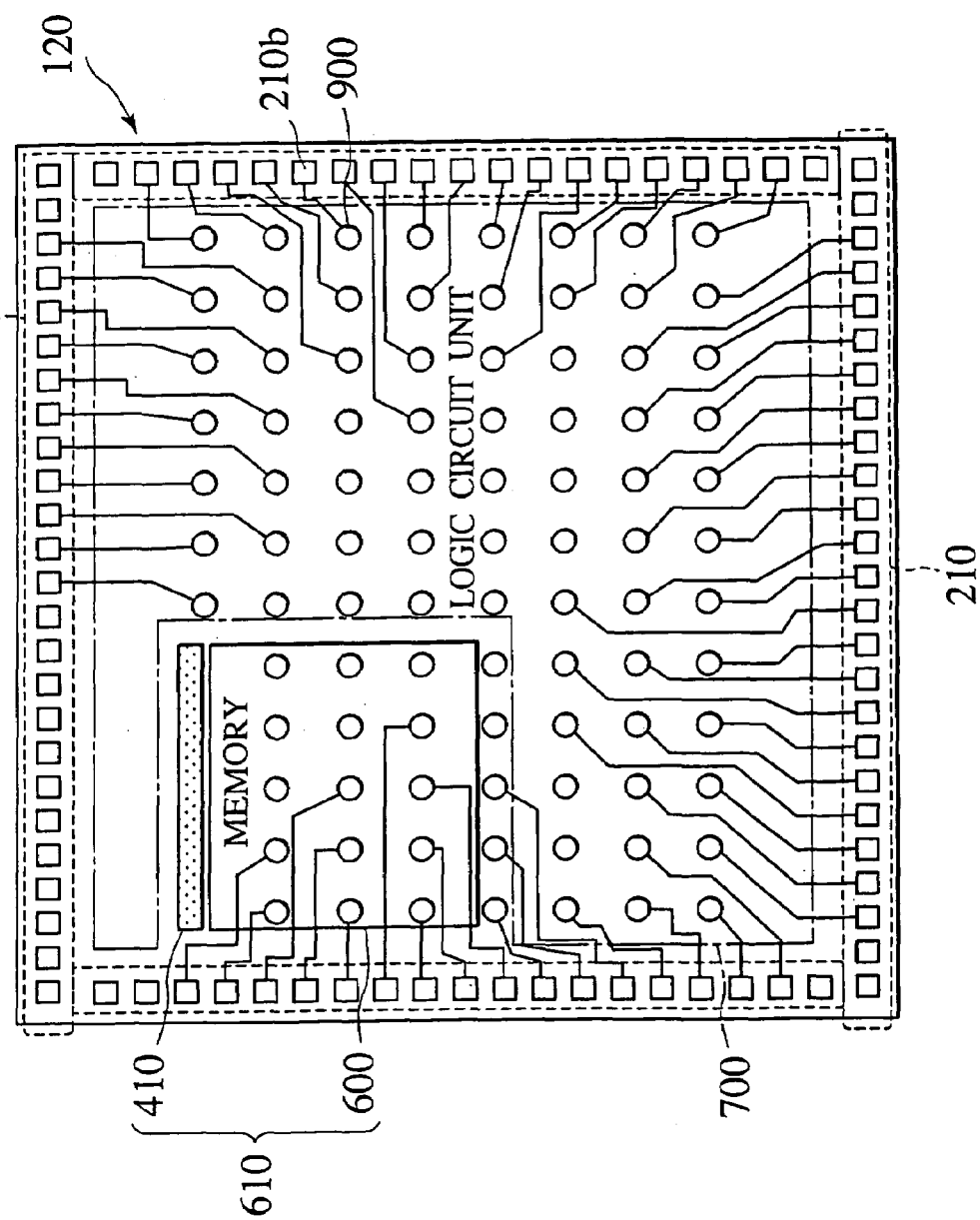
FIG. 3 is a planar view of another conventional chip with a logic circuit unit and a memory macro unit.

A semiconductor chip according to a first embodiment of the present invention is a memory embedded chip, which comprises electrode pads to be used as bonding pads, and has a fuse unit group arranged on the outside of the bonding pads. This is described in more detail in the following while referencing the drawings.

FIG. 4 is a planar view showing a configuration of a semiconductor chip 10 according to the first embodiment. A memory macro unit 20 and a logic circuit unit 30 are provided on respectively independent regions upon semiconductor chip 10, and there surrounding, electrode pad rows 40 or the bonding pads, are arranged substantially along each edge of the semiconductor chip.

A memory cell array, a memory circuit, and the like are formed inside a memory macro unit 20. Further, redundant cells and a redundant circuit are provided for defect cell recovery inside the memory macro unit 20. Meanwhile, a fuse unit group 50, which stores the address of a defect cell, is arranged in a region along an edge of the semiconductor chip on the outside of an electrode pad row 40 that is separated from the memory macro unit 20. More specifically, the fuse unit group 50 is disposed between the edge of the chip and an electrode pad row 40.

Since the fuse unit group 50 is arranged on the outside of an electrode pad row 40, it is not necessary for the uppermost layer of interconnects such as the signal lines and power source lines, which are formed on the inside of the electrode pad rows 40, to be routed around the fuse unit group 50. Accordingly, a wider degree of freedom is allowed for the interconnect layout, which makes interconnect layout much easier. In addition, since it is also possible to simplify the interconnect architecture and shorten the length of each interconnect, a wire delay time accompanying the interconnect length may be reduced.

It is noted that the address information for a defect cell stored in the fuse unit group 50 must be transferred to the memory macro unit 20. The number of transfer interconnects connecting the memory macro unit 20 and the fuse unit group 50 should be kept to a minimum, preferably using only one fuse data transfer line 60 as shown in FIG. 4.

Figure 5A:
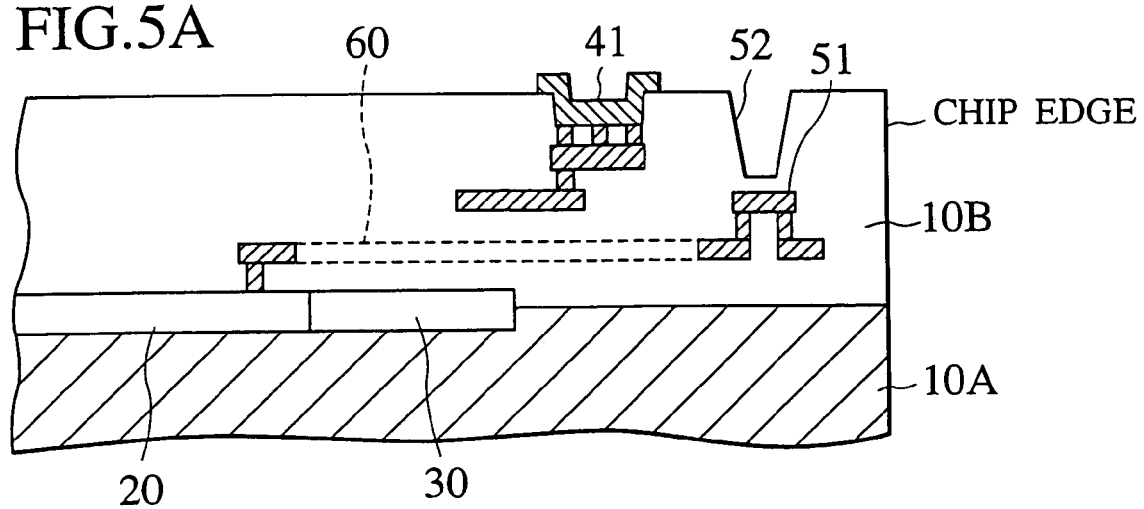
FIG. 5A is a schematic cross-sectional view cut along line A–A' in FIG. 4.

FIG. 5A is a schematic cross-sectional view cut along line A–A' in FIG. 4; 5B is a schematic cross-sectional view cut along line B–B' in FIG. 4.

A semiconductor chip 10 includes a substrate layer 10A, and an interconnect layer 10B thereupon. The necessary elements of the memory macro unit 20, each memory cell of the logic circuit unit 30, and each circuit are formed in the upper layer of the substrate layer 10A. The interconnects necessary for the memory macro unit 20 and the logical circuit unit 30 as well as the interconnects connecting the electrode pads 41 to these circuits are formed in an interconnect layer 10B. These interconnects are formed with a multi-layer construction wherein a dielectric film insulates between each layer of interconnects.

A fuse 51 is formed in the interconnect layer 10B between the electrode pads 41 and the edge of the chip. A window 52 is provided on the fuse 51 to make the blow process using laser radiation easier. In addition, data for each fuse indicating whether or not blowing has been performed (hereafter referred to as 'fuse data') is transferred to a redundant circuit inside memory macro unit 21 via fuse data transfer line 60, which is shown by a broken line in the Figure.

Figure 5B:
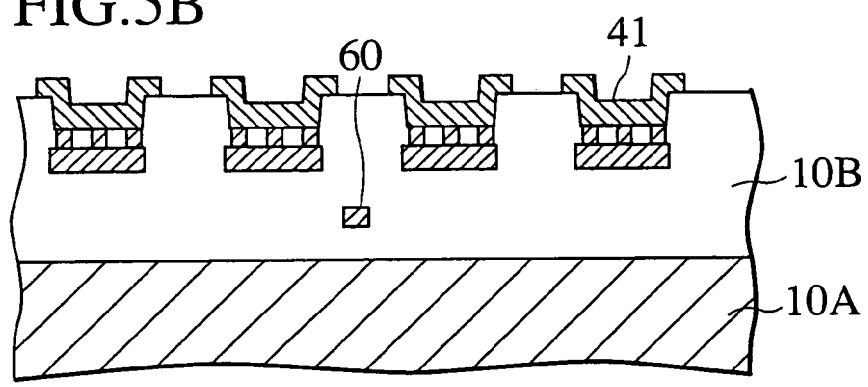
FIG. 5B is a schematic cross-sectional view cut along line B–B' in FIG. 4.
Figure 5C:
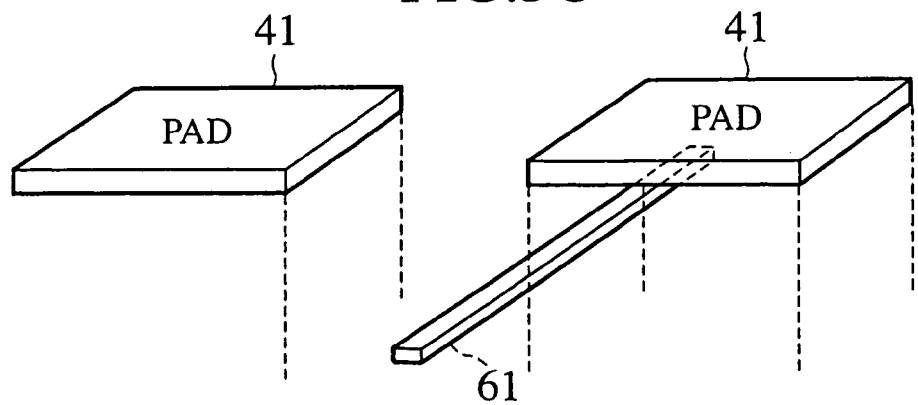
FIG. 5C is a perspective view showing the positional relationship between electrode pads 41 and a fuse data transfer line 60 in FIG. 4.

FIG. 5C is a perspective view showing the positional relationship between the electrode pads 41 and the fuse data transfer line 60. Since the electrode pads 41 are used as bonding pads and they are under great stress during the bonding process, interconnects should not pass directly under electrode pads 41. Accordingly, it is desirable that the fuse data transfer line 60, as shown in FIG. 5B and FIG. 5C, pass between electrode pads 41. Alternatively, in the case where the fuse data transfer line 60 is passed directly under any of the electrode pads 41, it is preferable that such electrode pad 41 be made a dummy pad and not be subjected to bonding.

In this manner, when an electrode pad 41 is used as a bonding pad, it is preferable that the number of interconnects between the memory macro unit 20 and the fuse unit group 50 be kept to a minimum, because there is little room for interconnects to pass between the electrode pads.

Figure 6:
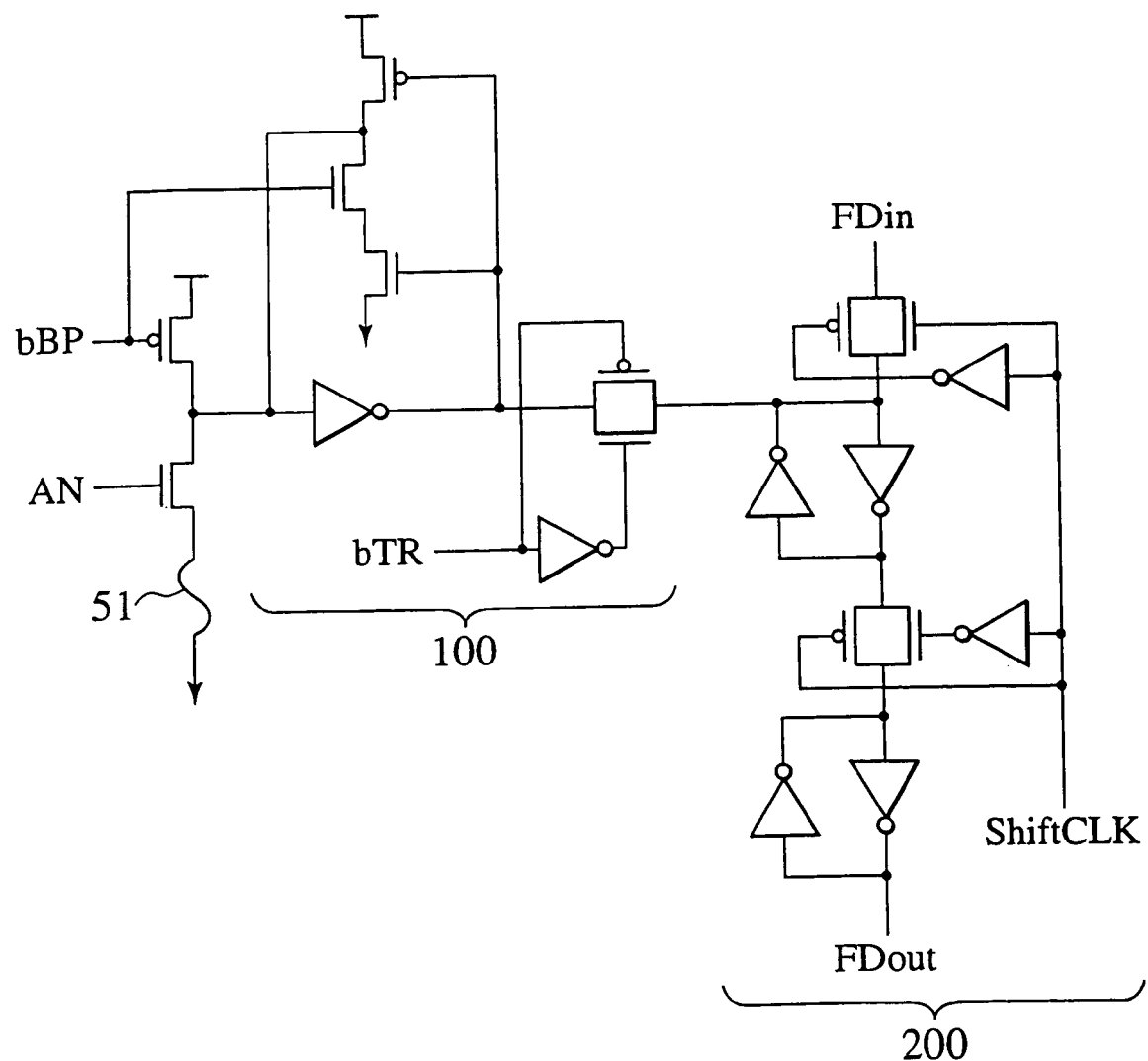
FIG. 6 is a circuit block diagram showing an individual fuse unit according to the first embodiment of the present invention.
Figure 7:
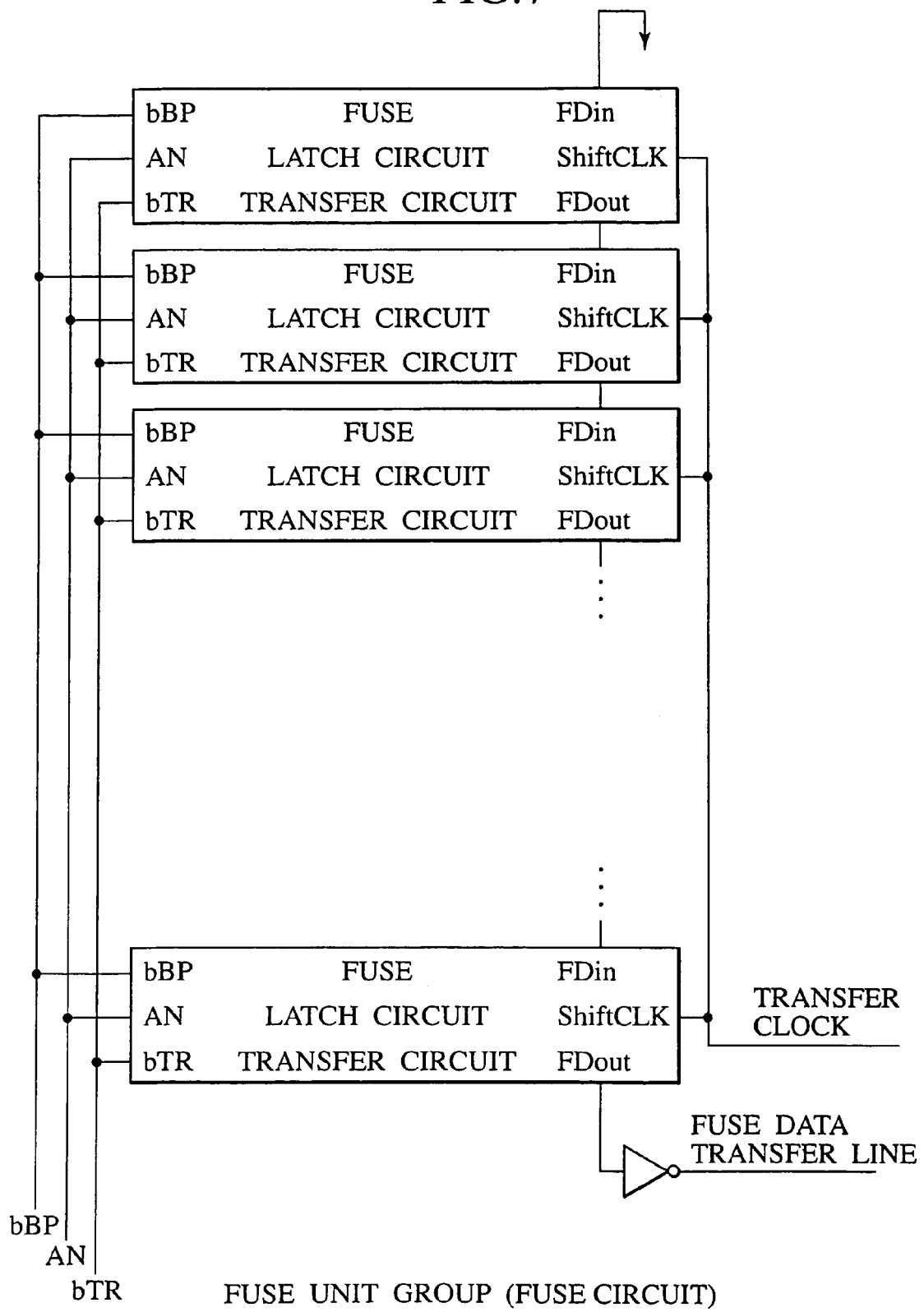
FIG. 7 is a circuit block diagram of a fuse unit group according to the first embodiment of the present invention.
Figure 8:
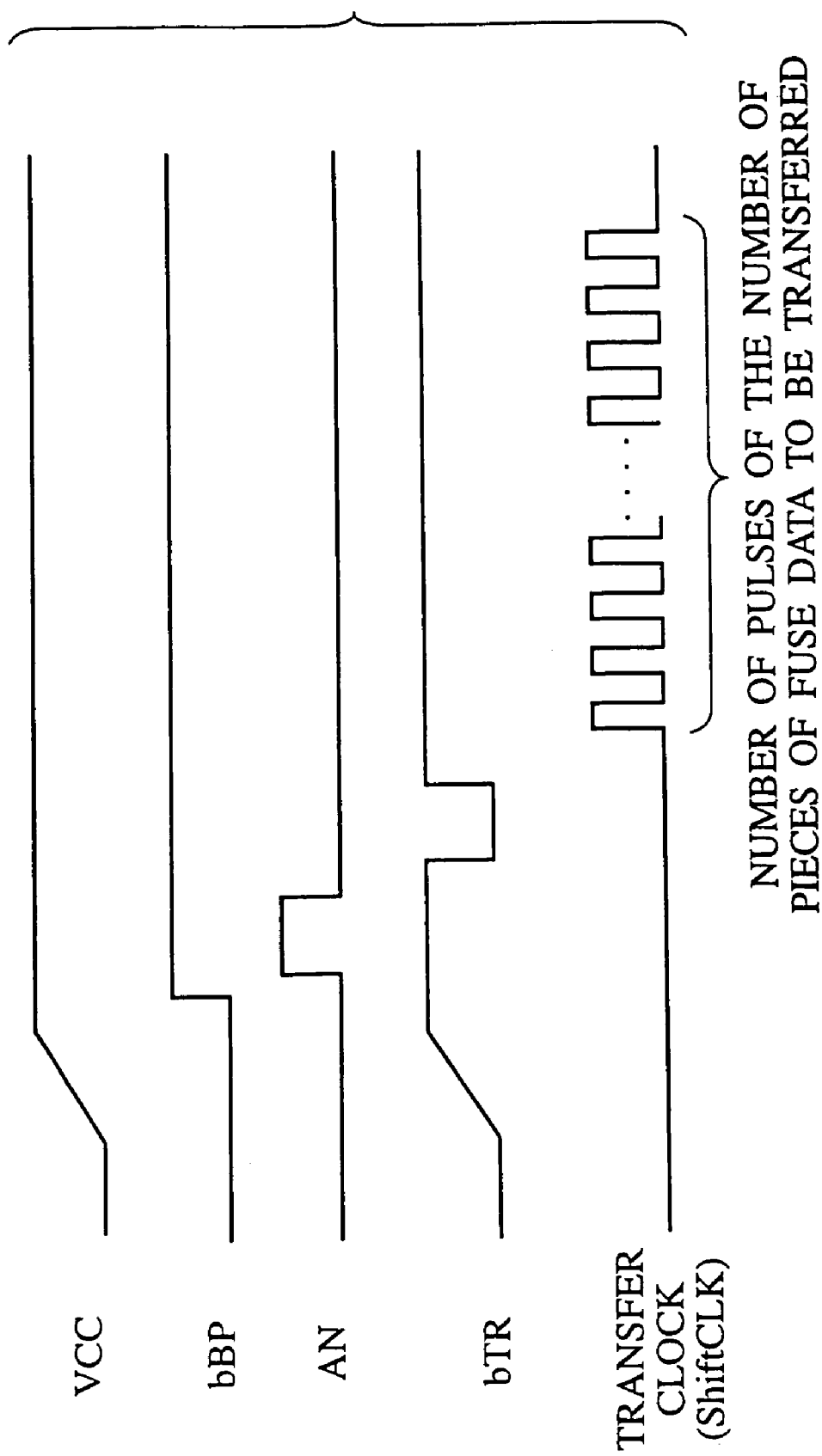
FIG. 8 is a diagram showing the sequence of each signal occurring with the fuse unit group circuit according to the first embodiment of the present invention.

FIG. 6 shows an example of the circuit structure of each fuse unit in the semiconductor chip of the first embodiment. FIG. 7 shows an example of the overall circuit structure of the fuse unit group. FIG. 8 shows the sequence of each signal in the fuse unit circuit.

As shown in FIG. 6, each fuse unit includes a fuse 51, a latch circuit 100, and a transfer circuit 200, and as shown in FIG. 7, these circuits are repeated and arranged in a row within fuse unit group 50. Initialization signals bBP, AN, and bTR for each circuit are inputted to each fuse unit.

As shown in FIG. 8, as energizing occurs (VCC becomes ON), first, the bBP signal becomes "HIGH" level, initializing latch circuit 100. Then, the AN signal develops a "HIGH" pulse signal, and transfers a signal corresponding to the data of the fuse 51, namely a signal showing the state of the fuse 51, either "blown" or "not blown". Following this, the bTR signal develops a "LOW" pulse signal, the latch circuit 100 sends the fuse data to the transfer circuit 200, and the data is temporarily stored here.

Thereafter, as a "HIGH" level pulse signal, which is the transfer CLOCK (Shift CLK) signal, is sent, pieces of fuse data having a count corresponding to the signal count of this pulse signal are transferred sequentially from the transfer circuit via the one strand of fuse data transfer line to the memory macro unit.

Figure 9:
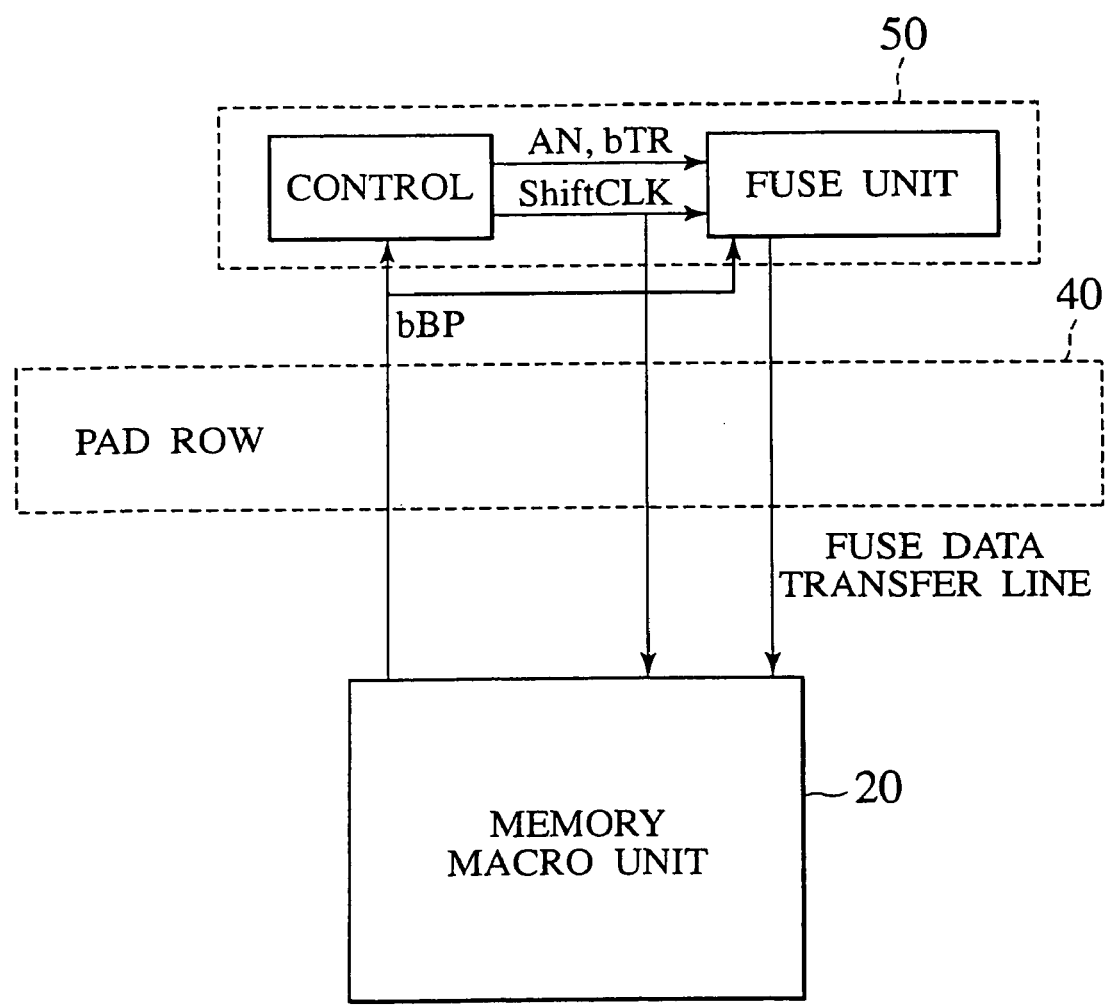
FIG. 9 is a circuit block diagram of the interconnects for signal lines between a fuse unit group and a memory macro unit according to the first embodiment of the present invention.

FIG. 9 is a diagram showing the configuration of a signal line between the fuse unit group 50 and the memory macro unit 20.

It is preferable that the bBP signal, the AN signal, the bTR signal, and the Shift CLK signal be generated synchronous to the semiconductor chip initialization control signal generated upon the rising edge of the power source of semiconductor chip. For example, when the power source for the memory peripheral circuit within the memory macro unit 20 is made by stepping down the external voltage by inside the semiconductor chip, it is preferable for the bBP signal to be generated within the memory macro unit 20 when this voltage has reached a predetermined voltage. After that, the bBP signal is transmitted to the fuse unit group 55.

Meanwhile, the AN signal, the bTR signal, and the Shift CLK signal are generated by the control circuit provided within the fuse unit group. For example, the bBP signal transmitted from the memory macro unit 25 is also transmitted to this control circuit. Then the control circuit generates the AN signal, the bTR signal, and the Shift CLK signal based on this bBP signal, and these signals are sent to the fuse unit. This makes it possible to reduce the number of signal lines between the memory macro unit 20 and the fuse unit group 50.

It is noted that since the Shift CLK signal is a signal for data transmission, it must also be supplied to the memory macro unit.

Accordingly, it is desirable that, as shown in FIG. 9, between the memory macro unit 20 and the fuse unit group 50, only the bBP signal line from the memory macro unit 20 to the fuse unit group 50 be provided, and the fuse data transfer line and the Shift CLK line from the fuse unit group 50 to the memory macro unit 20 be provided.

With the semiconductor chip according to the first embodiment, the fuse unit group 50 is positioned outside of the electrode pad that is some distance away from the memory macro unit 20, without arranging a fuse electron group 50 within the memory macro unit 20. Therefore, if the interconnects directly to the memory macro unit 20 are arranged for every fuse unit, the interconnects of the signal lines made to pass through the electrode pad row 40 may become complicated. However, as described above, if a plurality of fuse data is sent sequentially over a single signal line using a shift register, the number of signal lines may be greatly reduced. In addition, if the signal controlling the circuit operation of the fuse unit group 50 is generated by a control circuit arranged in the fuse unit group 50 whenever possible, then the number of signal lines connecting the fuse unit group 50 and the memory macro unit 20 may be reduced and may pass between electrode pads easily.

Second Embodiment

A semiconductor chip according to a second embodiment, as with the semiconductor chip of the first embodiment, is a memory embedded chip including electrode pads that are used as bonding pads.

Figure 10:
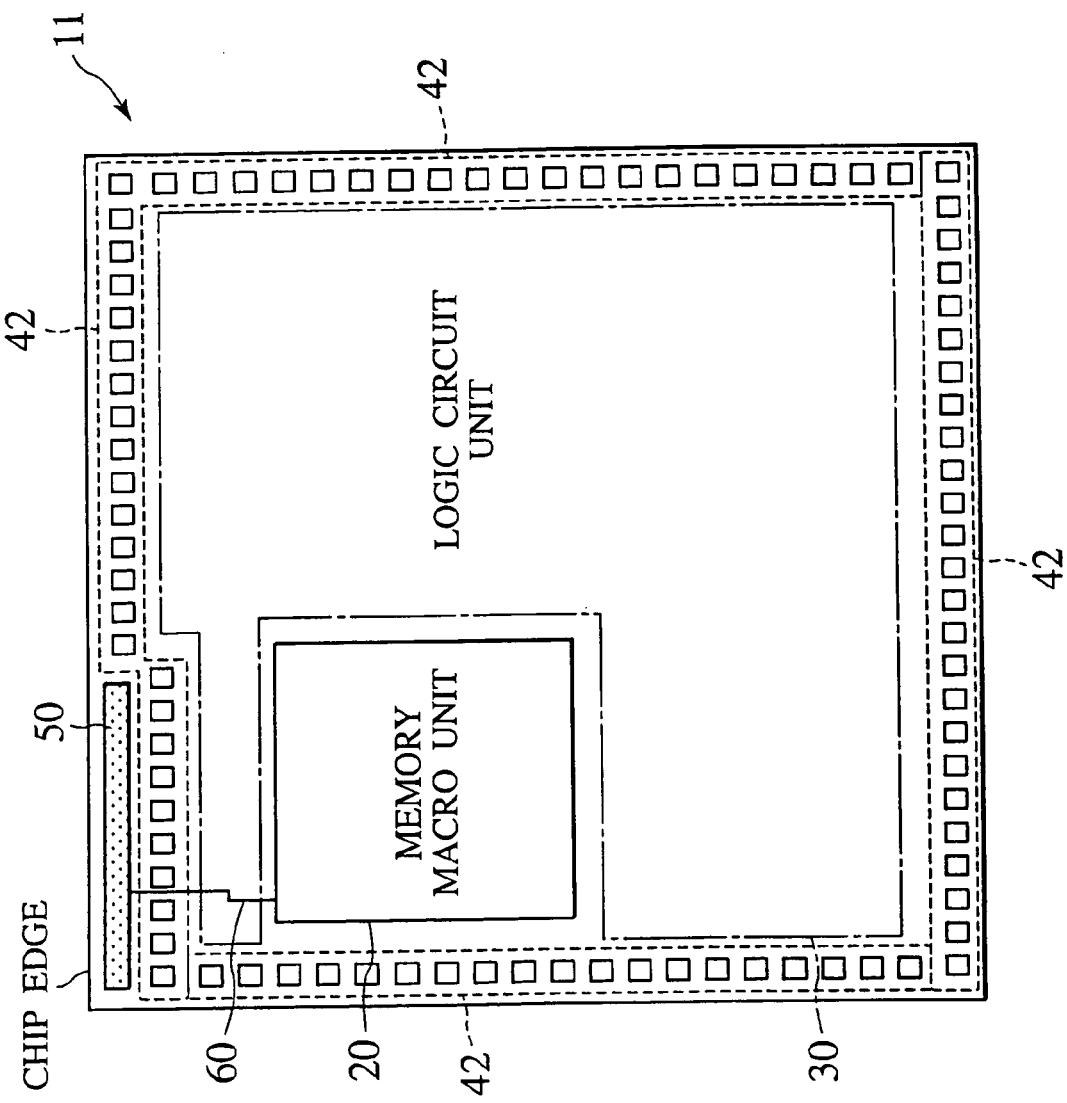
FIG. 10 is a planar view of a semiconductor chip according to a second embodiment of the present invention.

FIG. 10 is a planar view showing the configuration of a semiconductor chip 11 according to the second embodiment. As with the semiconductor chip 10 of the first embodiment, a memory macro unit 20 and a logic circuit unit 30 are formed in the chip plane. There surrounding, electrode pad rows 42, which are bonding pads, are arranged, and a fuse unit group 50 is arranged on the outside of these. It differs from the first embodiment in that the electrode pad rows 42 are arranged along the shape of the fuse unit group 50. More specifically, in regions where the fuse unit group 50 does not exist between the electrode pad rows 42 and the chip edge, the electrode pad rows are arranged along the edge of the chip. Therefore, as in the first embodiment, unlike when the electrode pad rows 42 are formed in a straight line, it is possible to eliminate the wasted space that is not used that exists between the electrode pad rows and the chip edge. Accordingly, a larger effective surface area upon a chip allowing formation of logic chips may be obtained with the same chip size.

It is noted that with the semiconductor chip of the second embodiment, it is also preferable that the circuit configuration of the fuse unit group 50 utilize the same circuit configuration as that of the first embodiment, and there be few signal lines connecting the fuse unit group 50 and the memory macro unit 20.

Third Embodiment

A semiconductor chip according to a third embodiment includes electrode pads and bumps, and has a fuse unit group arranged on the outside of the electrode pads.

Figure 11:
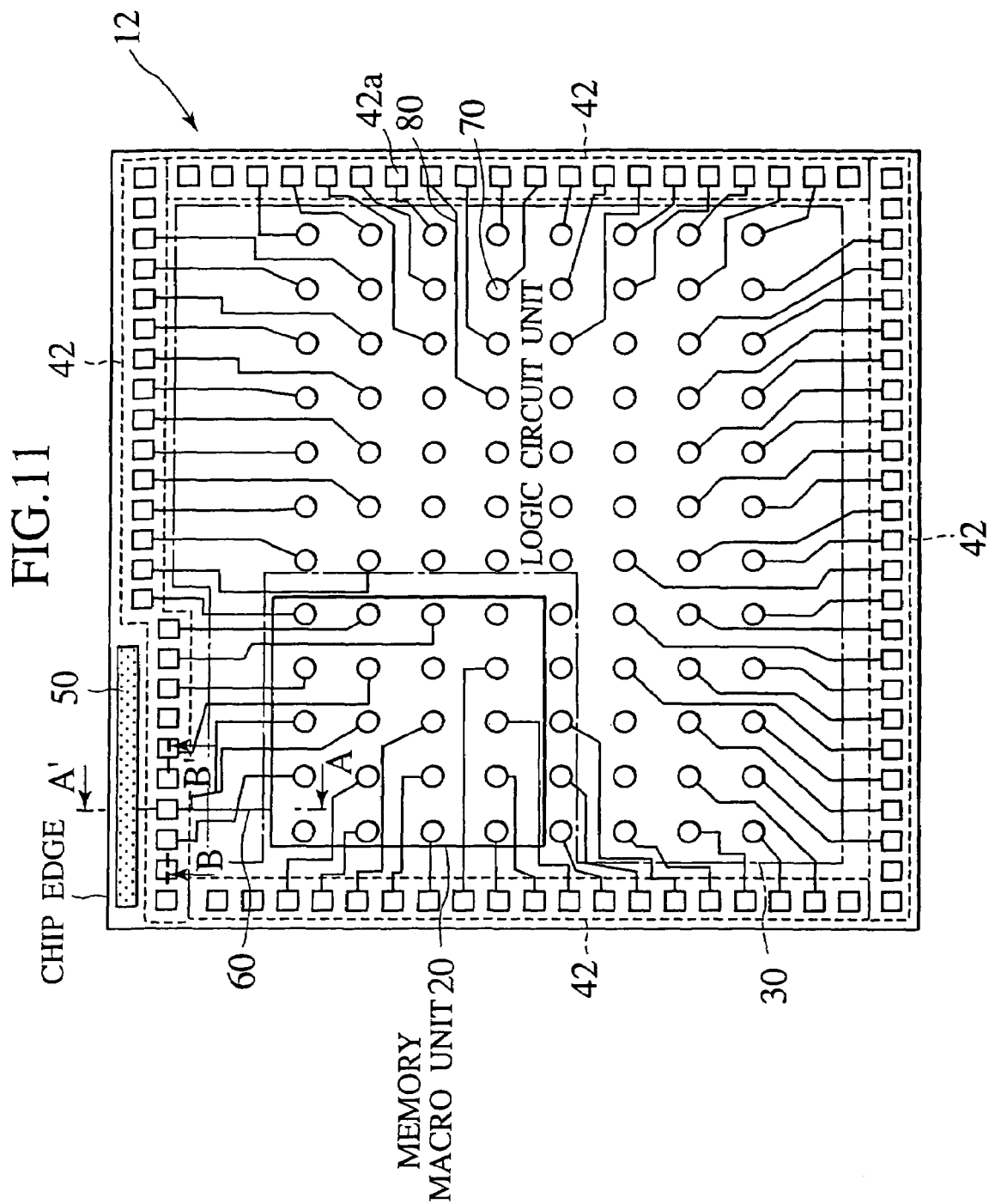
FIG. 11 is a planar view of a semiconductor chip according to a third embodiment of the present invention.

FIG. 11 is a planar view showing a configuration of a semiconductor chip 12 of the third embodiment. A memory macro unit 20 and a logic circuit unit 30 are provided on respectively independent regions upon semiconductor chip 12, and there surrounding, electrode pad rows 42 are arranged substantially along each edge of the semiconductor chip. Meanwhile, a fuse unit group 50 is arranged in a region along an edge of the chip on the outside of an electrode pad row 42 that is separated from the memory macro unit 20.

The electrode pad rows 42, as with the second embodiment, are bent part-way through to keep alongside of the fuse unit group 50 and not create any wasted space upon the chip. However, if there is room, the electrode pad rows may be arranged in a straight line as with the first embodiment.

In addition, above the memory macro unit 20 and the logic circuit unit 30, bumps 70 formed with a protuberant conductive material are arranged in a two-dimensional shape. Each electrode pad 42a is connected to each respective bump 70 with bump-pad interconnecting line 80, and each electrode pad 42a is connected to the external board, not with bonding, but via these bumps 70.

Figure 12A:
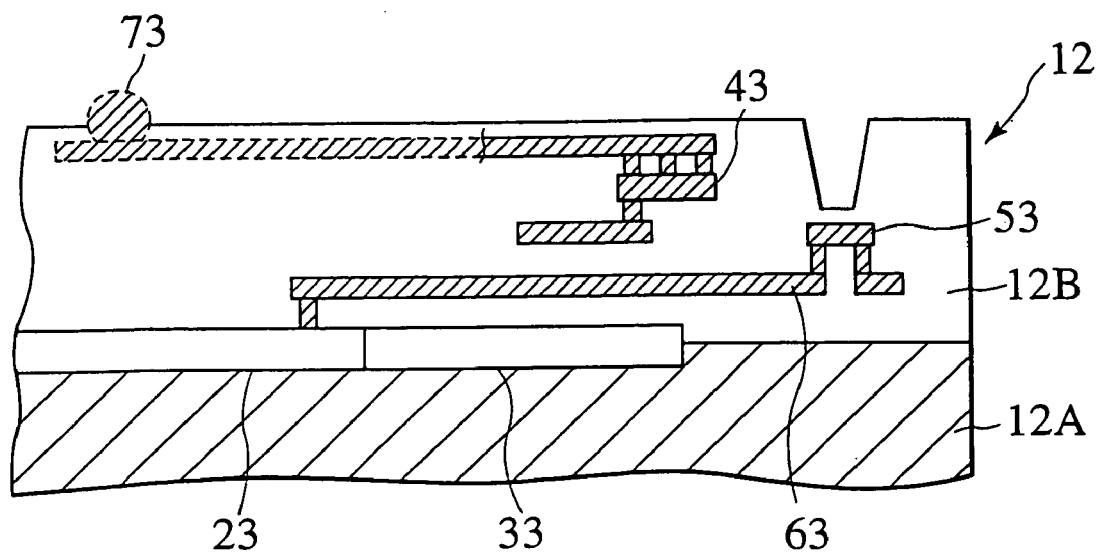
FIG. 12A is a schematic cross-sectional view cut along line A–A' in FIG. 11; 12B is a schematic cross-sectional view cut along line B–B' in FIG. 11.
Figure 12B:
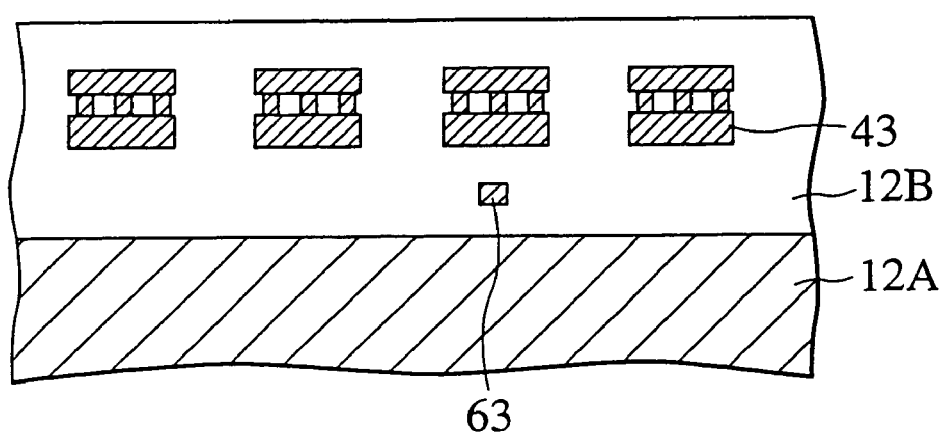

FIG. 12A is a schematic cross-sectional view cut along line A–A' in FIG. 11. FIG. 12B is a schematic cross-sectional view cut along line B–B' in FIG. 11.

The semiconductor chip 12, as with the first embodiment, includes a substrate layer 12A and an interconnect layer 12B there above, and has, for example, a memory macro unit 20 and a logic circuit unit 30 formed in the upper layer portion of the substrate layer 12A, and the interconnects required for the memory macro unit 20 and the logic circuit unit 30 and the interconnects that connect the electrode pads 43 and these circuits formed in the interconnect layer 12B.

One or more fuses 53 are formed in the interconnect layer 12B on the outside of the electrode pads 43, and the fuse data for each fuse 53 is transferred to the memory macro unit 23 via a fuse data transfer line 60.

With the semiconductor chip 12 of the third embodiment, since the electrode pads 43 are connected to the bumps 70 by the interconnects in the upper-most layer, and connected with the outer board via the bumps 70. There is no chance of the electrode pads 43 being stressed through the wire bonding. Accordingly, fuse data transfer lines 60, as shown in FIG. 12B, can be arranged passing directly under the electrode pads 43, and in comparison with the chips according to the first and second embodiments, which use bonding pads, there is little restriction on the interconnects connecting the fuse unit group 50 and the memory macro unit 20. Therefore, the interconnect configuration of the fuse unit group 50 is not limited, however, employment of a circuit configuration, preferably such as that of the first embodiment, is desirable from the point that interconnect configuration is simplified.

With the semiconductor chip 12 of the third embodiment, since the fuse unit group 50 is separated from the memory macro unit 20 and arranged on the outside of the electrode pad rows 42, neither interconnects such as the signal line and the power source line, which connect between the logic circuit unit 30 and each electrode pad 42a, nor the interconnects connecting the electrode pads 42a and the bumps 70 are restricted by the existence of fuse unit group 50. Thus more liberal interconnect layout may be allowed.

In addition, as conventionally there were with the region on the inside of the electrode pad rows 42, regions where bumps cannot be arranged disappear. Accordingly, a more liberal arrangement of bumps 70 may also become possible, allowing bumps 70 to be arranged substantially evenly upon the chip surface.

Moreover, with a semiconductor module, thermal stress can easily develop due to the difference in coefficients of thermal expansion of the semiconductor chip 12 and the external board due to the fact that they become connected via the bumps 70. Since the bumps are evenly arranged, tension can be dispersed evenly throughout the entire chip surface. As a result, problems such as peeling away of the board may become less likely to occur.

Fourth Embodiment

A semiconductor chip according to a fourth embodiment is a semiconductor chip that has bumps distributed on the chip surface, does not have electrode pads, and has a fuse unit group arranged on the outside of the bump formation region.

Figure 13:
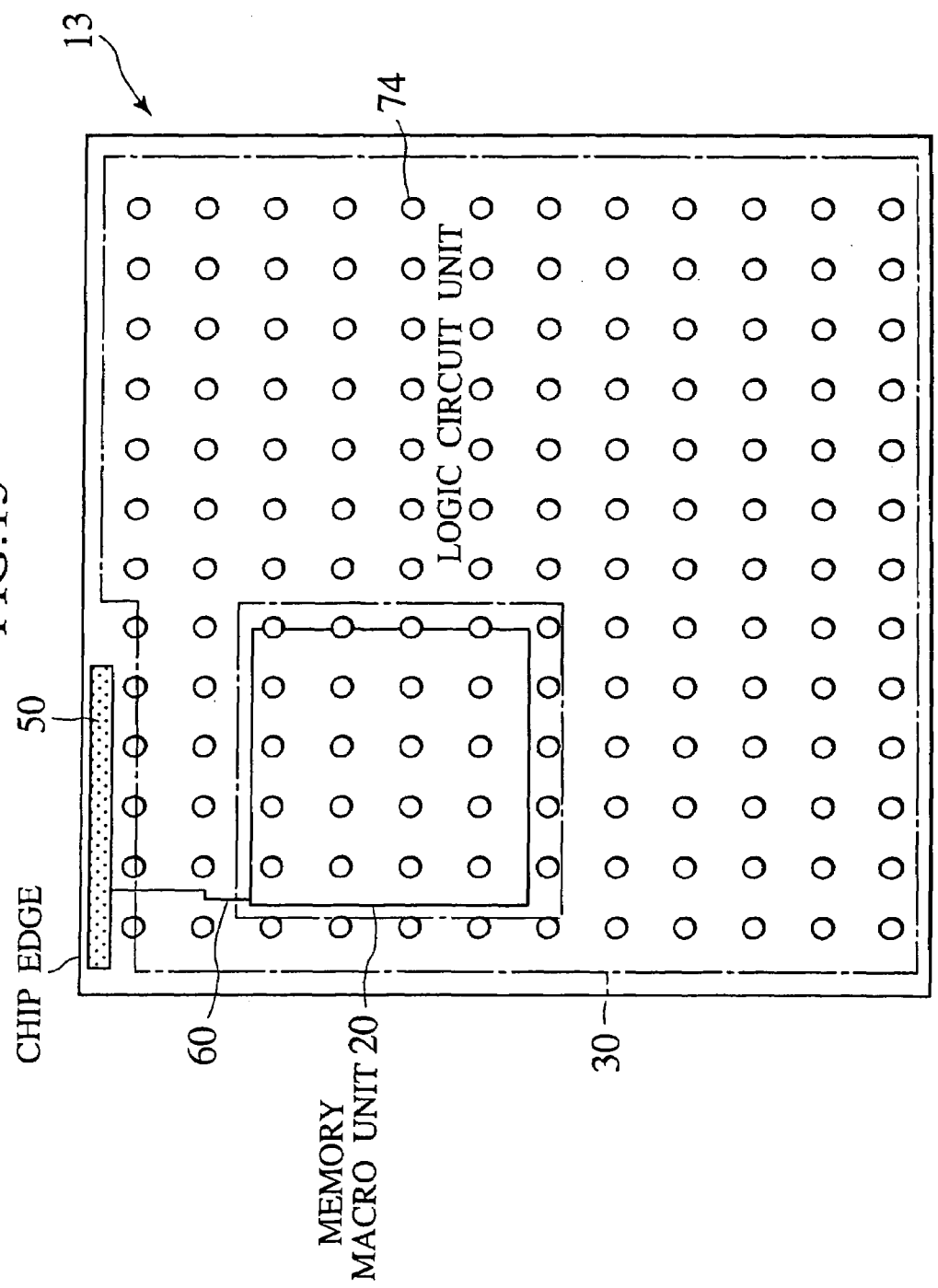
FIG. 13 is a planar view of a semiconductor chip according to a fourth embodiment of the present invention.

FIG. 13 is a planar view showing a configuration of a semiconductor chip 13 of the fourth embodiment. A memory macro unit 20 and a logic circuit unit 30 are arranged in respectively independent regions on the semiconductor chip 13. As it has no electrode pads, the logic circuit unit 30 may be widened up to almost the edge of the chip. A fuse unit group 50 is arranged along an edge of the chip on the outside of the bump formation region and separated from the memory macro unit 20.

With the semiconductor chip 13 of the fourth embodiment, the power source lines and the signal lines of the logic circuit unit 30 and the memory macro unit 20 are connected directly to the bumps 74 without going through the electrode pads, and connected to the external board via the bumps 74. Since the fuse unit group 50 exists on neither the logic circuit unit 30 nor the memory macro unit 20, the interconnect to each of the bumps 74 is not restricted by the existence of a fuse unit group 50.

In this manner, in accordance with the semiconductor chip 13 of the fourth embodiment, since the fuse unit group 50 is not formed within the memory macro unit 20, the interconnects of the bumps 74 are not restricted by the existence of the fuse unit group 50. Accordingly, the bumps 74 may be arranged evenly upon the chip surface in a two-dimensional pattern.

Figure 14:
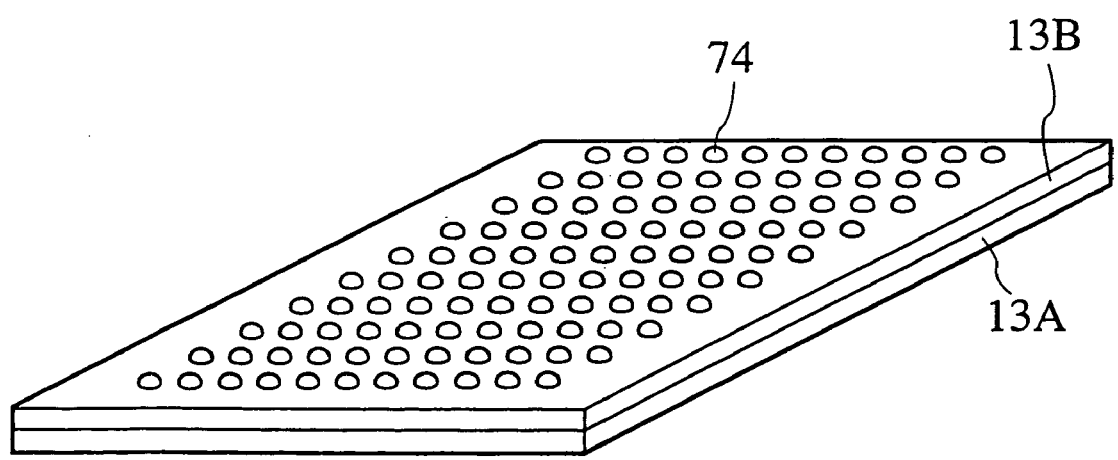
FIG. 14 is a perspective view of a semiconductor chip according to the fourth embodiment of the present invention.

FIG. 14 is a perspective view of a semiconductor chip 13 of the fourth embodiment. The appearance of the even arrangement of protuberant bumps 74 upon the surface of the chip is shown.

Figure 15:
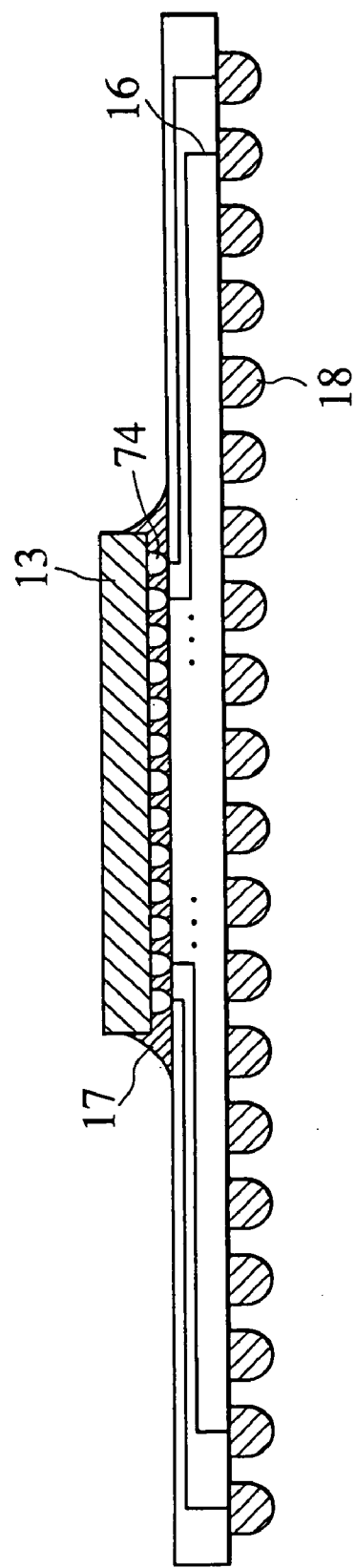
FIG. 15 is a cross-sectional view of a semiconductor module according to the fourth embodiment of the present invention.

FIG. 15 is a device cross-sectional view showing an example of a semiconductor module with the semiconductor chip of the fourth embodiment mounted on a package board. With the semiconductor module shown in the same Figure, the semiconductor chip 13 is mounted face down upon the package board. More specifically, the semiconductor chip 13 is mounted on the package board 16 by turning the semiconductor chip 13 upside-down so that the chip surface on which the bumps 74 are formed faces the surface of the package board 16.

The bumps 74, are made of a soldering material such as a metal alloy of lead (Pb) and tin (Sn) or a metal alloy of Sn and silver (Ag) and are attached and fixed upon the package board 16 by heating into a half-melted state. An adhesive resin 17 is filled in between the semiconductor chip 13 and the package board 16, and securely anchors the semiconductor chip 13 with the package board. Solder balls 18 are formed on the underside of the package board 16, and connection with this semiconductor module may be made via these soldering balls 18.

It is easy for the bumps 74 connecting the package board, which is formed of such as glass, ceramics, or resin, and the semiconductor chip 13 to come under thermal stress due to the large difference in the respective coefficients of thermal expansion.

However, since the bumps 74 are arranged substantially evenly throughout the entire surface of the semiconductor chip 13, the tension exerted on the bumps 74 may be distributed evenly, and development of, for example, detachment may be suppressed. As a result, the rate of manufacturing defects may be reduced.

In addition, when performing ASIC design, since design may be possible with the presumption that the bumps are arranged substantially evenly throughout the semiconductor chip surface, layout considering various bump layout conditions, as was the case conventionally, may be no longer necessary. Accordingly, the design burden may be drastically reduced.

With the semiconductor chip of the fourth embodiment as well, it is noted that circuit configuration of the fuse unit group preferably utilizes a circuit similar to that of the first embodiment.

Other Embodiments

The first through fourth embodiments above are described using examples where the fuse unit groups are arranged together in one location, however, fuse unit groups may be arranged distributed among a plurality of locations. When these fuse unit groups may be formed along the edges of the chip, it is preferable that the arrangement be made as evenly as possible. For example, it is preferable that the plurality of fuse unit groups be arranged as symmetrically as possible with the center of the semiconductor chip as a center.

Moreover, with the first through fourth embodiments, the case where one memory macro unit is provided is shown. The memory macro unit is not limited to being only one, however, a plurality of memory macro units may be used. For example, in the case of using the first through fourth semiconductor chips as buffer memory for communications, a plurality of memory macro units may be loaded corresponding to a memory storage capacity of 128 Mbits through 256 Mbits or greater. In this case, a plurality of fuse unit groups corresponding to the plurality of memory macro units may be together in one location, or may even be arranged distributed throughout a plurality of locations. When the fuse unit groups are distributed and arranged as described above, it is preferable that each fuse unit group be arranged symmetrically with the center of the semiconductor chip as the center in order for even fuse unit group arrangement upon the chip.

In this manner, by having balanced arrangement of the plurality of fuse unit groups upon the chip surface, stress that may develop during fuse blowing or other types of stress may be distributed evenly throughout the surface, and the development of localized stress may be suppressed.

The fuse unit group is preferably arranged at a position somewhat separated from each corner of the semiconductor chip where various types of stress may be concentrated.

In addition, with the semiconductor chip of the first through third embodiments, which have electrode pads, examples are described where the peripheries of both the memory macro unit and the logic circuit unit are completely enclosed with the electrode pad rows, however, it is not always necessary for these to be completely enclosed. The outer periphery of the memory macro unit and the logic circuit unit may be arranged on one portion. The number of electrode pads may be that which meets the necessary number of input/output terminals. In addition, with the electrode pads of the third embodiment, one portion thereof may include bonding pads.

It is noted that in the case of forming a semiconductor module using a semiconductor chip according to the first or second embodiment, as with the case of the fourth embodiment, the semiconductor chip and terminals upon the package board may be connected with bonding wires and the semiconductor chip and the package board may be anchored with an adhesive resin.

The type of memory formed within the memory macro unit is not limited and may include the use of any of a variety of memory such as, for example, Dynamic Random Access Memory (DRAM), Static Random Access Memory (SRAM), nonvolatile memory, ferroelectric memory, or magnetic memory, as long as it is memory having redundant cell configuration.

The semiconductor chip of this embodiment, not only allows easier interconnects for connecting the electrode pads or the bumps, but also in the case when bumps are used, allows the chip surface to be used more effectively so that more bumps may be arranged. Accordingly, application is possible for semiconductor chips requiring a large number of input/output terminals. Since it is an embedded memory type of semiconductor chip having a memory macro unit and a logic circuit unit formed, the data transmission rate is extremely high. Accordingly, utilization may be possible for a semiconductor chip requiring high-speed data transfer in addition to requiring many input/output terminals. More specifically, usage may be most applicable, for example, in a communication buffer memory chip, which sorts communication data received from a plurality of directions.

The present invention is described in terms of a plurality of embodiments, however, the present invention is not limited to the above described embodiments. The possibility for various modifications and improvements may become obvious to persons having a skill in the art.

As described above, a higher degree of freedom may be allowed in the interconnect layout of, for example, signal lines and/or power source lines and the burden placed on interconnect layout lightened as a result of arranging a fuse unit group on the outside of the electrode pad rows in a chip embedded with a logic circuit unit and a memory circuit unit in accordance with a semiconductor chip having a first feature of the present invention.

According to the semiconductor module of the present invention, a semiconductor module on which a semiconductor chip including the above-mentioned first or second feature is mounted may be provided.

What is claimed is:

1. A semiconductor chip, comprising:
   a logic circuit unit;
   a memory macro unit;
   electrode pad rows being arranged around on outside of the logic circuit unit and the memory macro unit;
   a fuse unit group being arranged in a region along any edge of the semiconductor chip; and
   a signal line connecting the fuse unit group and the memory macro unit,
   wherein she logic circuit and the memory macro unit are positioned lower than the electrode pad rows, and the signal line passes under the electrode pad rows.

2. The semiconductor chip according to claim 1, wherein the fuse unit group is provided in a plurality of fuse unit groups, which are arranged distributed on the semiconductor chip surface.

3. The semiconductor chip according to claim 1, wherein the fuse unit group is provided in a plurality of fuse unit groups, which arc arranged substantially symmetrical with a central point on the semiconductor chip surface.

4. The semiconductor chip according to claim 1 wherein the fuse unit group is a arranged away from each corner of the semiconductor device.

5. The semiconductor chip according to claim 1 wherein the memory macro unit is provided in a plurality of memory macro units.

6. The semiconductor chip according to claim 1, wherein the memory macro unit is provided in a plurality of the memory macro units;
   the fuse unit group is provided in a plurality of the memory macro unit groups;
   each of the fuse unit groups exists independently for each of the memory macro units; and
   the fuse unit groups are arranged substantially symmetrical with the center of the chip surface.

7. The semiconductor chip according to claim 1 wherein the memory macro unit is provided in a plurality of memory macro units;
   the fuse unit group is provided in a plurality of fuse unit groups;
   each of the memory macro units and each of the fuse unit groups, which correspond to each other, are formed together in one region, respectively.

8. The semiconductor chip according to claim 1, wherein the signal line allows a plurality of fuse data to be sequentially transferred and passes between an electrode pad and another electrode pad, which are arranged between the fuse unit group and the memory macro unit.

9. The semiconductor chip according to claim 1, wherein the signal line allows a plurality of fuse data to be sequentially transferred and passes directly under an electrode pat, and the electrode pad is not utilized as a bonding pad.

10. The semiconductor chip according to claim 1, further comprising a plurality of bumps being disposed above the semiconductor chip surface and arranged in a two dimensional pattern on an inside of the electrode pad rows, and wherein the fuse unit group is provided in a plurality of fuse unit groups, which are arranged distributed on the semiconductor chip surface.

11. The semiconductor chip according to claim 1, further comprising a plurality of bumps being disposed above the semiconductor chip surface and arranged in a two dimensional pattern on an inside of the electrode pad rows, and wherein the fuse unit group is provided in a plurality of fuse unit groups, which are arranged substantially symmetrical with a central point on the semiconductor chip surface.

12. The semiconductor chip according to claim 1, further comprising a plurality of bumps being disposed above the semiconductor chip surface and arranged in a two dimensional pattern on an inside of the electrode pad rows, and wherein the fuse unit group is a arranged away from each corner of the semiconductor device.

13. The semiconductor chip according to claim 1, further comprising a plurality of bumps being disposed above the semiconductor chip surface and arranged in a two dimensional pattern on an inside of the electrode pad rows, and wherein the memory macro unit is provided in a plurality of memory macro units.

14. The semiconductor chip according to claim 1, further comprising a plurality of bumps being disposed above the semiconductor chip surface and arranged in a two dimensional pattern on an inside of the electrode pad rows, and wherein the memory macro unit is provided in a plurality of the memory macro units;
   the fuse unit group is provided in a plurality of the memory macro unit groups;
   each of the fuse unit groups exists independently for each of the memory macro units; and
   the fuse unit groups are arranged substantially symmetrical with the center of the chip surface.

15. The semiconductor chip according to claim 1, further comprising a plurality of bumps being disposed above the semiconductor chip surface and arranged in a two dimensional pattern on an inside of the electrode pad rows, and wherein the memory macro unit is provided in a plurality of memory macro units;
   the fuse unit group is provided in a plurality of fuse unit groups;
   each of the memory macro units and each of the fuse unit groups, which correspond to each other, are formed together in one region, respectively.

16. The semiconductor chip according to claim 1, wherein the fuse unit group comprises;

a plurality of fuses;

a latch circuit for latching fuse data, which is data showing whether or not each of the fuses has been blown; and a transferring a plurality of stored fuse data to the memory macro unit, and wherein the signal line allows a plurality if fuse data to be sequentially transferred and passes between an electrode pad and another electrode pad, which are arranged between the fuse unit group and the memory macro unit.

17. The semiconductor chip according to claim 1, wherein the fuse unit group comprises:

a plurality of fuses;

a latch circuit for latching fuse data, which is data showing whether or not each of the fuses has been blown; and a transferring a plurality of stored fuse data to the memory macro unit, and wherein the signal line allows a plurality if fuse data to be sequentially transferred and passes directly under an electrode pat, and the electrode pad is not utilized as a bonding pad.

* * * * *